United States Patent
Chen (10) Patent No.: US 7,480,582 B2
(45) Date of Patent: Jan. 20, 2009

(54) FLASH MEMORY CARD TEST DEVICE WITH MULTIPLE INTERFACES

(75) Inventor: Ban-Hui Chen, Taipei County (TW)

(73) Assignee: Phison Electronics Corp., Miaoli (TW)

( * ) Notice: Subject to any disclaimer, the term of this patent is extended or adjusted under 35 U.S.C. 154(b) by 29 days.

(21) Appl. No.: 11/613,178

(22) Filed: Dec. 19, 2006

(65) Prior Publication Data

US 2008/0147950 A1 Jun. 19, 2008

(51) Int. Cl.
*G06F 11/22* (2006.01)
*G06F 11/273* (2006.01)

(52) U.S. Cl. .................. 702/117; 702/118; 702/108; 714/718

(58) Field of Classification Search .................. 702/117, 702/108, 118, 186
See application file for complete search history.

(56) References Cited

U.S. PATENT DOCUMENTS

| | | | | |
|---|---|---|---|---|
| 5,611,057 A | * | 3/1997 | Pecone et al. ............... | 710/301 |
| 5,680,579 A | * | 10/1997 | Young et al. ................ | 711/157 |
| 6,351,827 B1 | * | 2/2002 | Co et al. ....................... | 714/42 |
| 7,095,618 B1 | * | 8/2006 | Mambakkam et al. ...... | 361/737 |
| 2002/0059492 A1 | * | 5/2002 | Sabotta et al. .............. | 710/301 |
| 2003/0133270 A1 | * | 7/2003 | Liu et al. ..................... | 361/728 |
| 2004/0111240 A1 | * | 6/2004 | Oh et al. ...................... | 702/186 |
| 2004/0177302 A1 | * | 9/2004 | Mori et al. ................... | 714/738 |
| 2004/0194062 A1 | * | 9/2004 | Kuo et al. .................... | 717/124 |
| 2004/0202015 A1 | * | 10/2004 | Tai et al. ...................... | 365/154 |
| 2004/0267481 A1 | * | 12/2004 | Resnick et al. .............. | 702/117 |
| 2005/0105360 A1 | * | 5/2005 | Takiar et al. ................. | 365/222 |
| 2005/0261856 A1 | * | 11/2005 | Kushnick et al. ............ | 702/117 |
| 2007/0239935 A1 | * | 10/2007 | Chen ........................... | 711/115 |

* cited by examiner

*Primary Examiner*—Hal D Wachsman
(74) *Attorney, Agent, or Firm*—Jianq Chyun IP Office (57) ABSTRACT

A flash memory card test device with multiple interfaces is disclosed. The flash memory card test device comprises at least one connection interface adaptor board and a test circuit board. The test circuit board is adapted for determining a specification of a flash memory to be tested and transmitting a test signal to test the flash memory.

11 Claims, 14 Drawing Sheets

FIG.6A  MCU + USB INTERFACE

FIG. 6B

FIG.6C  MCU +USB INTERFACE

*MCU +USB INTERFACE*

*FIG.6D*

MCU +USB
INTERFACE

FLASH MEMORY CARD TEST DEVICE WITH MULTIPLE INTERFACES

BACKGROUND OF THE INVENTION

1. Field of the Invention

The present invention provides a flash memory card test device with multiple interfaces, and more particularly to a flash memory card test device comprises a test circuit board with a specification detector pin to detect the specification of a memory card to be tested, such that the test circuit board transits a test signal to the flash memory card for testing.

2. Description of Related Art

With the rapid development in the flash memory technology, recently, the manufacturers progressively developed flash memory with a large storage capacity. For example, MP3 player, personal digital assistant (PDA), digital camera, digital video camera, other multimedia devices and communication devices such as cellular phones, have memory card. The general audio/video players available on the market have at least a control chip and a flash memory, wherein the flash memory may be adapted for downloading the decoded/recorded audio/video data from a computer. Furthermore, a storage device including only a flash memory is being developed to expand the memory capacity of the computer. A user may simply plug in or remove the storage device for retrieving or storing information. Ever since the flash memory is available, it has become an essential device for the users.

However, the flash memory has different specifications or application requirement, and accordingly a variety of types, sizes and specifications of the memory cards are required. The currently available memory cards mostly include MMC (multimedia card), CF (compact flash card), SMC (smart media card), MS (memory stick) and SD (secure digital memory card).

Before the flash memory card is marketed, manufacturers usually test the flash memory using a flash memory card test device to detect defects in the flash memory card and to ensure it performs properly. Thus, the manufacturing process must also include a testing step by using a flash memory card test device. If the design of the test device is poor, not only the flash memory card test device is inconvenient to use but also the time and the manufacturing cost is increased. Different flash memory card test devices may be required to test the flash memory card with different specifications. The application of the flash memory is also various, and also the design and improvement of the capacity, interface and the function of the flash memory card are also more complicated. Therefore, how to mass-produce the flash memory card with different interfaces and how to maintain an acceptable quality of the flash memory cards is an important issue for the manufacturers in the field.

SUMMARY OF THE INVENTION

According to an aspect of the embodiment, the present invention provides a plurality of test circuit board and a connection interface adaptor board for connecting various memory cards with different specifications. Thus, it is possible to test the flash memory cards with different specifications by using the same flash memory card test device. Thus, the cost of the flash memory card test device for testing flash memory cards with different specifications may be effectively reduced.

According to another aspect of the present invention, the test circuit board includes one or a plurality of flash memory card control interface, and when one of the test circuit board or one of the flash memory card control interface is damaged, the damaged test circuit board or the damaged flash memory card control interface can be replaced/repaired without replacing the whole flash memory card test device. Thus, the time and cost for maintaining the test device can be effectively reduced.

DETAIL DESCRIPTION OF THE INVENTION

Figure 1:
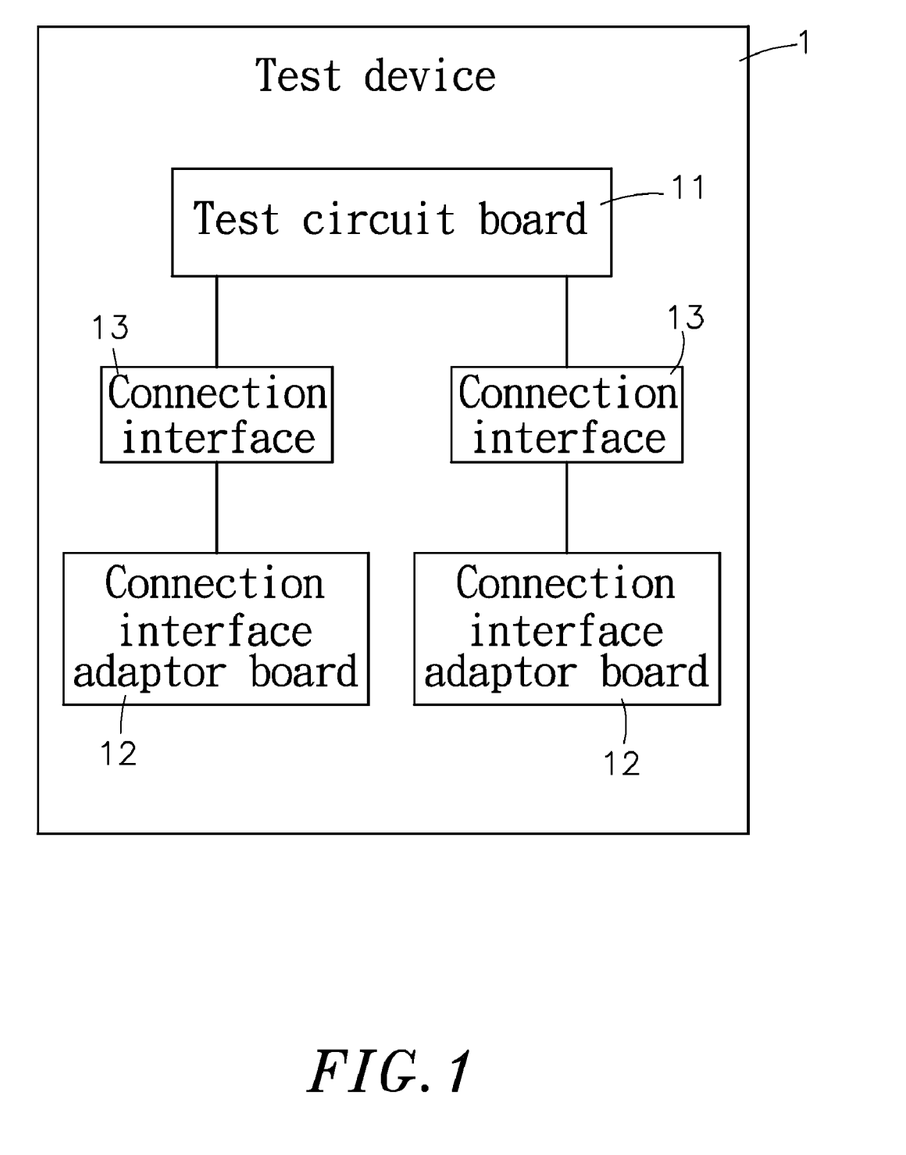
FIG. 1 is a block diagram of a flash memory card test device according to an embodiment of the present invention.

Referring to FIG. 1, a test device 1 of the present invention comprises a test circuit board 11, a plurality of connection interface adaptor board 12 and a plurality of connection interface 13. The test circuit board 11 is connected to the connection interface adaptor board 12 via the connection interface 13.

Figure 2:
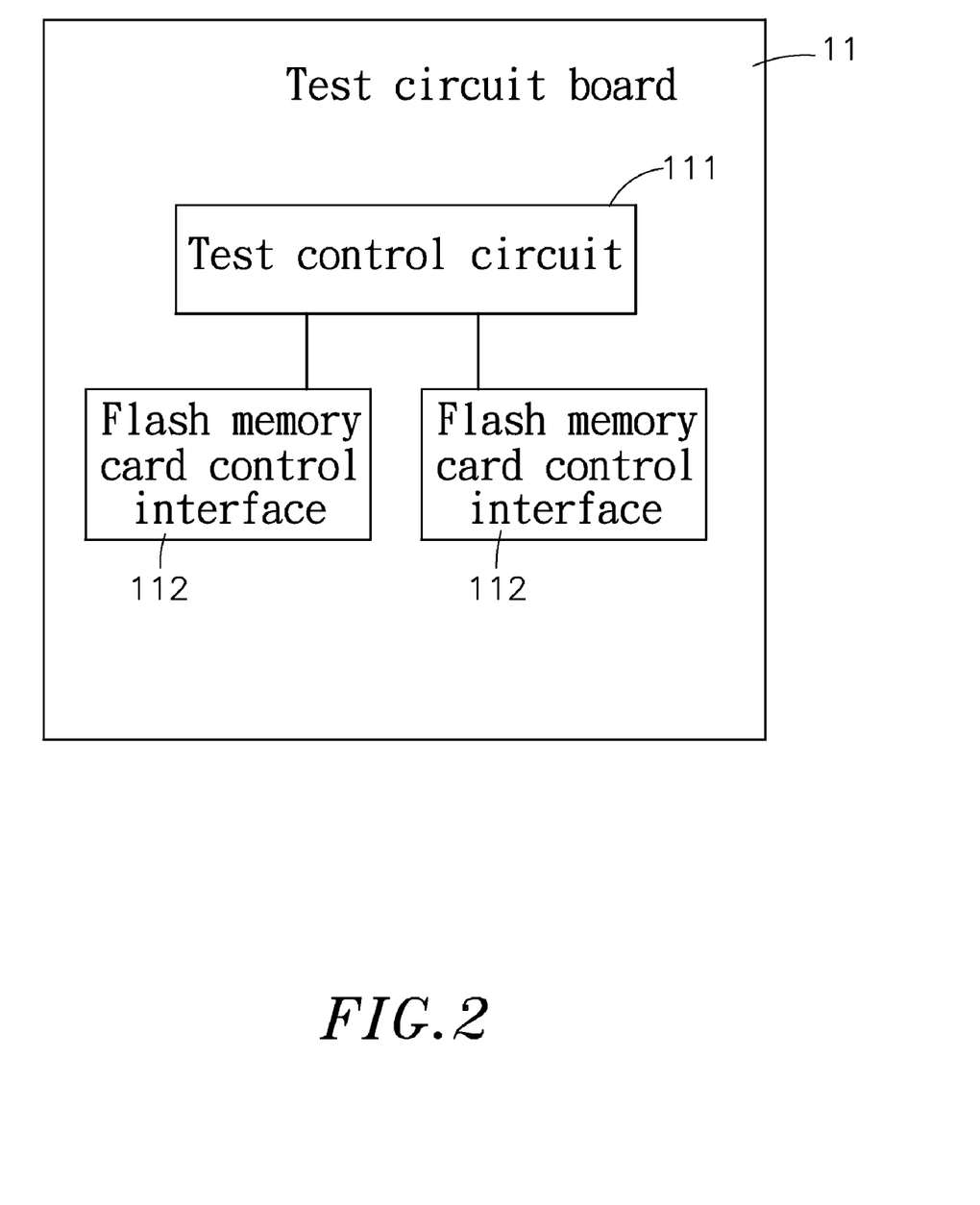
FIG. 2 is a block diagram of a test circuit board according to an embodiment of the present invention.

Referring to FIG. 2, the test circuit board 11 comprises a test control circuit 111 and a firmware program for controlling the test control circuit 111. The test circuit board 11 also comprises a plurality of flash memory card control interface 112.

Referring to FIGS. 3, 6A-6E, 7, 8A-8B, 9 and 10, the test control circuit 111 comprises a microprocessor 1111 for determining the specification of a memory card through a memory card specification detector pin, a short circuit detector circuit 1112 for detecting the current value through a short circuit detector pin, a memory card power supply circuit 1113 for supplying power to a memory card, and a memory card slot 1114 for receiving a memory card. When the short circuit occurs, the short circuit detector circuit 1112 of the test control circuit 111 can cut off power supply via the memory card power supply circuit 113, without going through the microprocessor 1111, and thereby minimize the damage to the test circuit board 11.

Figure 4:
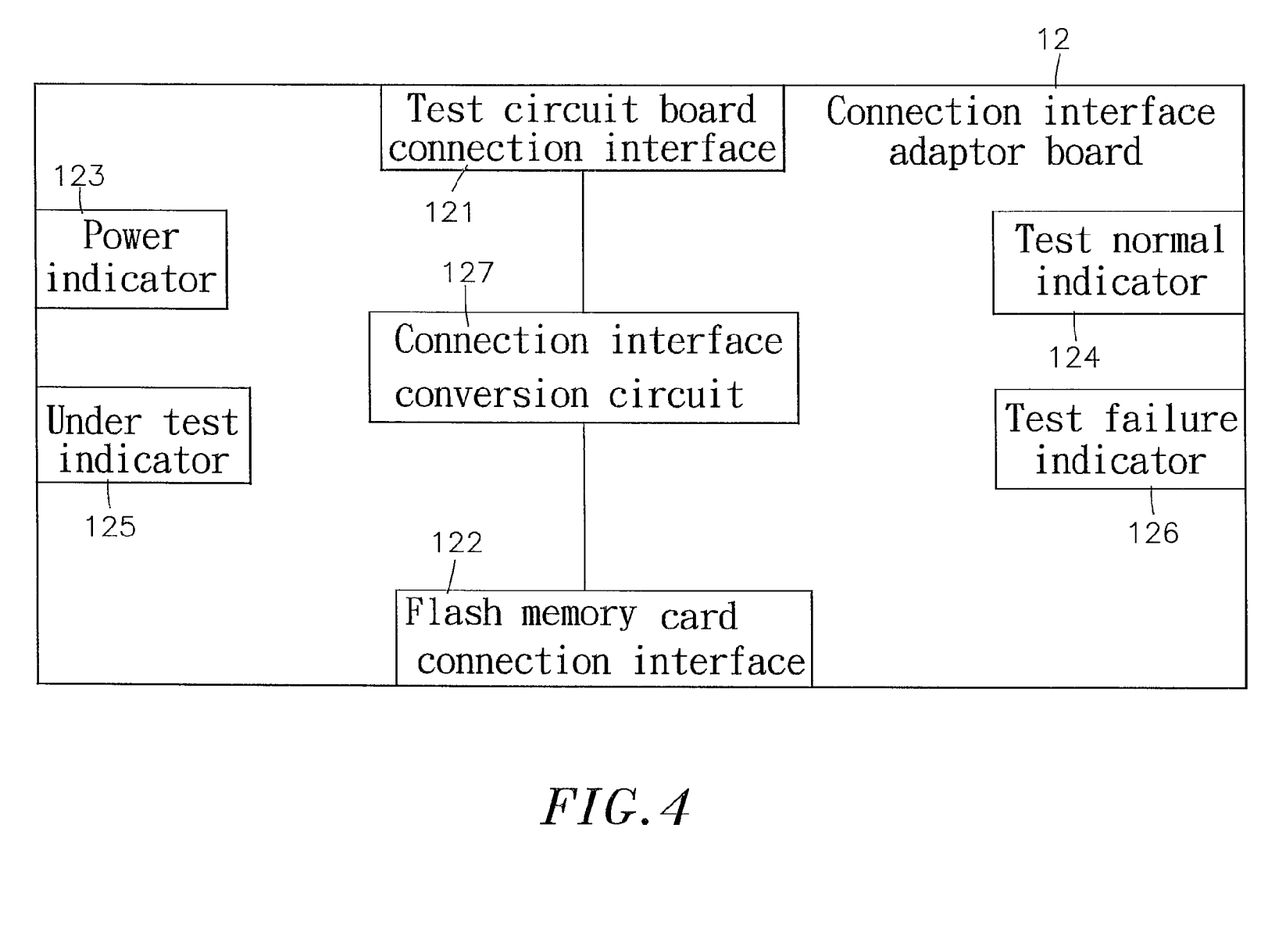
FIG. 4 is a block diagram of a connection interface adaptor board according to an embodiment of the present invention.

Referring to FIG. 4, the connection interface adaptor board 12 comprises a test circuit board connection interface 121, a flash memory card connection interface 122, a connection interface conversion circuit 127, a power indicator 123, a test normal indicator 124, a under test indicator 125 and a test failure indicator 126. The test circuit board 11 can test a flash memory card through the test circuit board connection interface 121, the connection interface conversion circuit 127 and the flash memory card connection interface 121, and a test result may be displayed by the power indicator 123, the test normal indicator 124, the under test indicator 125 and the test failure indicator 126 in order to notify the status of the flash memory card to the user.

Referring to FIGS. 1, 2, 3 and 4 again, the relationship between the test circuit board 11, the connection interface adaptor board 12 and the connection interface 13 is described hereinafter. The flash memory card control interface 112 of the test circuit board 11 is electrically coupled to the test circuit board connection interface 121 of the connection interface adaptor board 12 via the connection interface 13, and the test circuit board connection interface 121 is electrically coupled to the flash memory card connection interface 122 via the connection interface conversion circuit 127. Thus, a flash memory card can be tested by the test circuit board 11 when connecting the flash memory card to the flash memory card connection interface 122. Furthermore, the operation of the test device 1 of the present invention can be controlled or monitored by a built-in application program of an operating system.

To test at least one flash memory card, the flash memory card is connected to the flash memory card connection interface 122 of the connection interface adaptor board 12. When the flash memory card is electrically connected to the test device 1, a test signal is transmitted from the test control circuit 111 and the flash memory card control interface 112 of the test circuit board 11 in an orderly manner through the connection interface 13 to the connection interface adaptor board 12. Next, the test circuit board connection interface 121 of the connection interface adaptor board 12 transmits the test signal to the flash memory card connection interface 122 through the connection interface conversion circuit 127 for processing a test. After the testing of the flash memory card is completed, a test result may be further transmitted back the connection interface adaptor board 12 and may be displayed by the test normal indicator 124, the under test indicator 125 and the test failure indicator 126 for showing the status of the flash memory card. Furthermore, throughout the testing process, the power indicator 123 is turned on, and the under test indicator 125 flashes continuously. If the flash memory card functions normally, the test normal indicator 124 may be turned on. On the other hand, if the flash memory card breaks down, the test failure indicator 126 may be turned on. Accordingly, it is easy to understand whether or not the test of the flash memory card is complete, failed or under processing stage. The status of the flash memory card may not only be displayed by the indicators of the connection interface adaptor board 12 but also may be displayed on a monitor through the built-in application program of the operating system.

Figure 3:
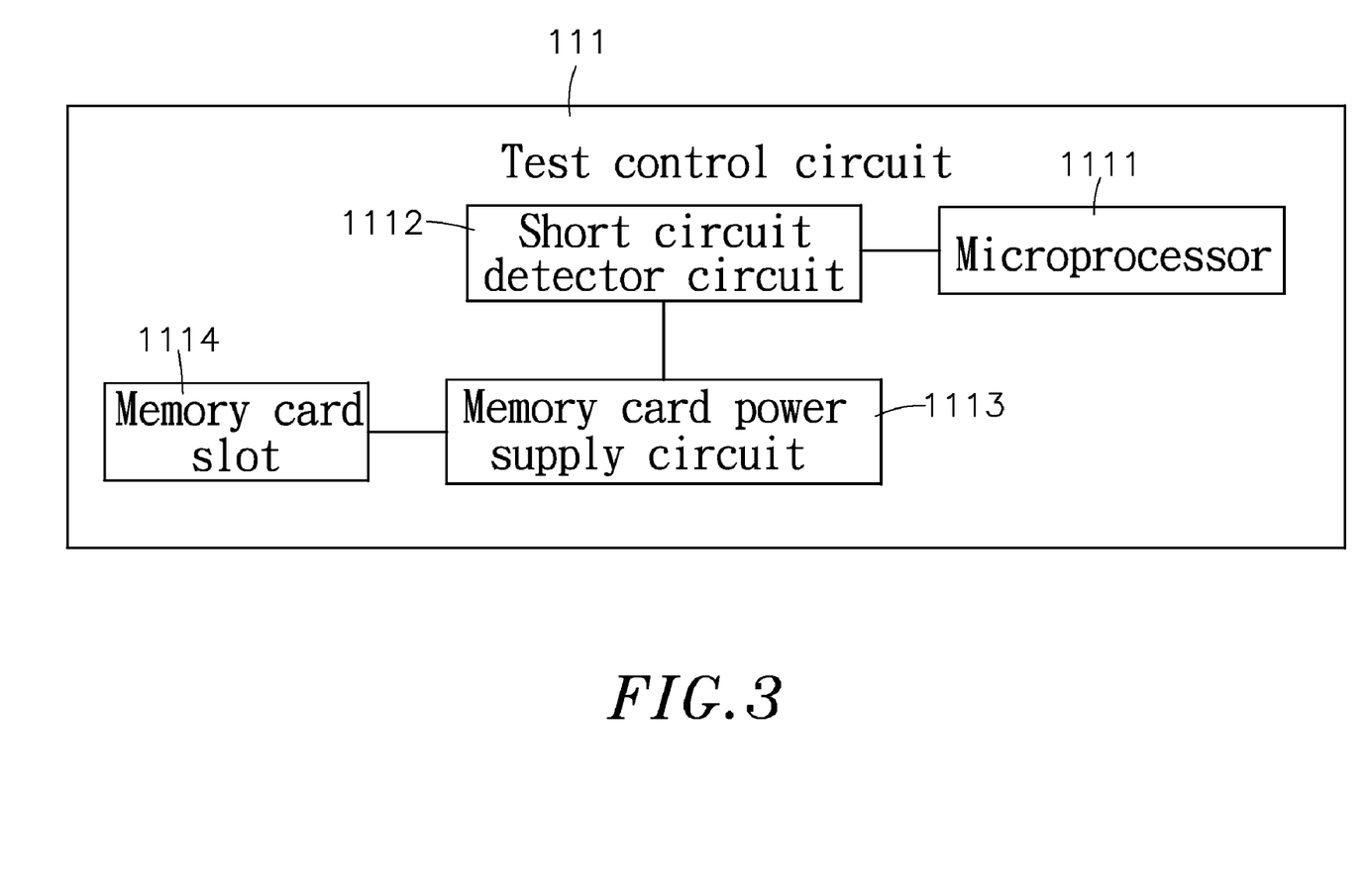
FIG. 3 is a block diagram of the test control circuit according to an embodiment of the present invention.

However, before connecting the flash memory card to the flash memory card connection interface 122, the memory card specification detector pin in the microprocessor 1111 of the test control circuit 111 can detect a connecting signal for a specific memory card, and the connecting signal is set as a definition value, for example, a high power level or a low power level. Therefore, when connecting the specific memory card to the flash memory card connection interface 122, because a signal corresponding to the connecting position in the memory card is opposite to an electric signal of the memory card specification detector pin, the memory card specification detector pin retrieves a power level opposite to the definition value. In other words, the specific memory card is connected if the test circuit board 11 detects an opposite power level. On the other hand, no memory card is connected or the connected memory card has a different specification if the test circuit board 11 detects a same power level. Furthermore, when the current of the test circuit board 11 is over a maximum current value set by the short circuit detecting circuit 1112, the short circuit detector pin of the short circuit detector circuit 1112 is 0. Otherwise, the short circuit detector pin is 1 in the normal situation indicating the circuit status to the microprocessor 1111. When the short circuit occurs, the short circuit detector circuit 1112 turns off the memory card power supply circuit 1113 and cuts off the power supply to the memory card slot 1114 to protect the memory card and the test circuit board 11. After the current of the test circuit board 11 is restored to a stable condition and the short circuit situation is solved, the short circuit detector circuit 1112 turns on the memory card power supply circuit 1113 and restores the power supply to the memory card slot 1114.

Figure 5:
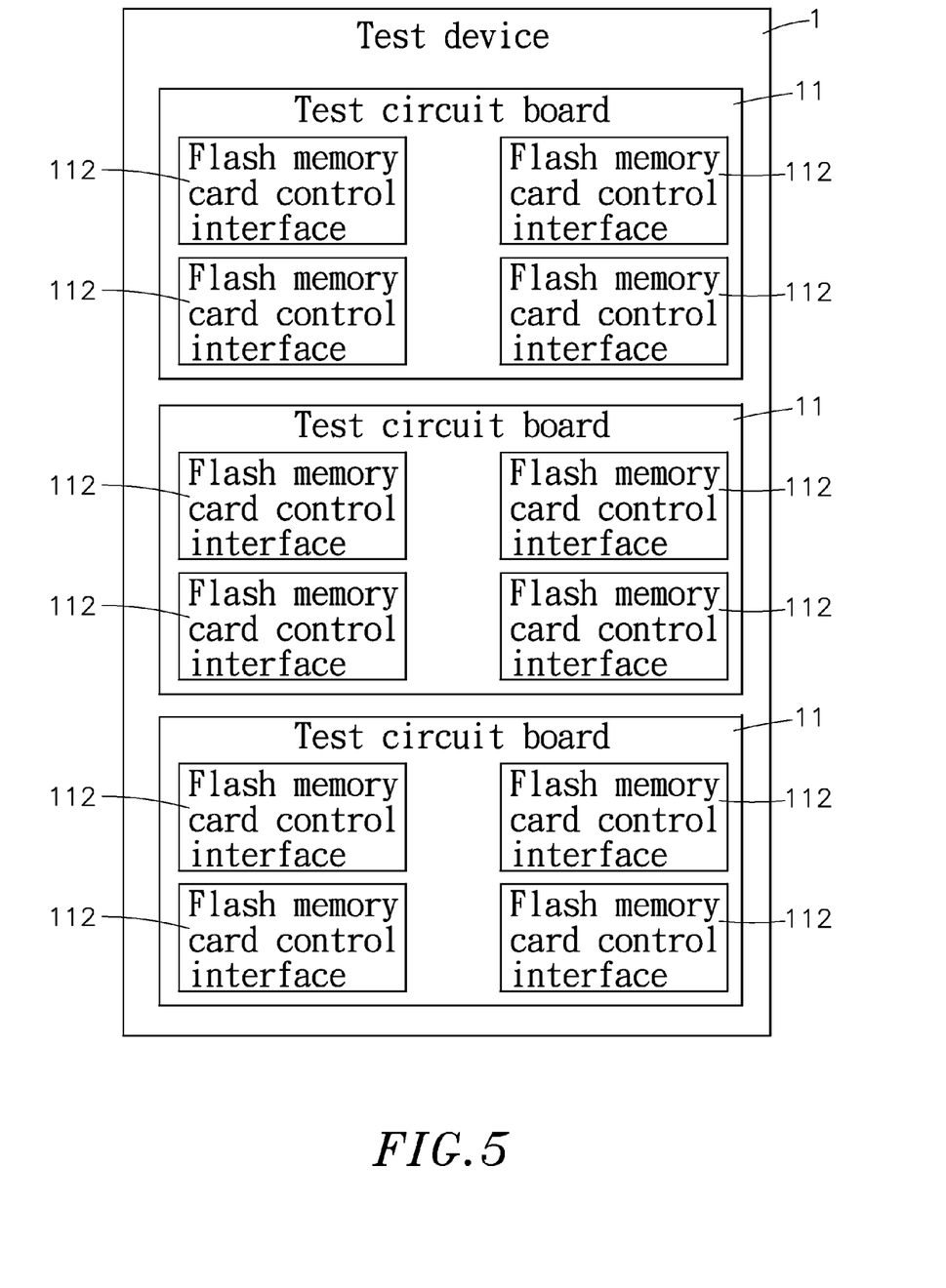
FIG. 5 is a block diagram of a flash memory card test device according to another embodiment of the present invention.
Figure 6A:
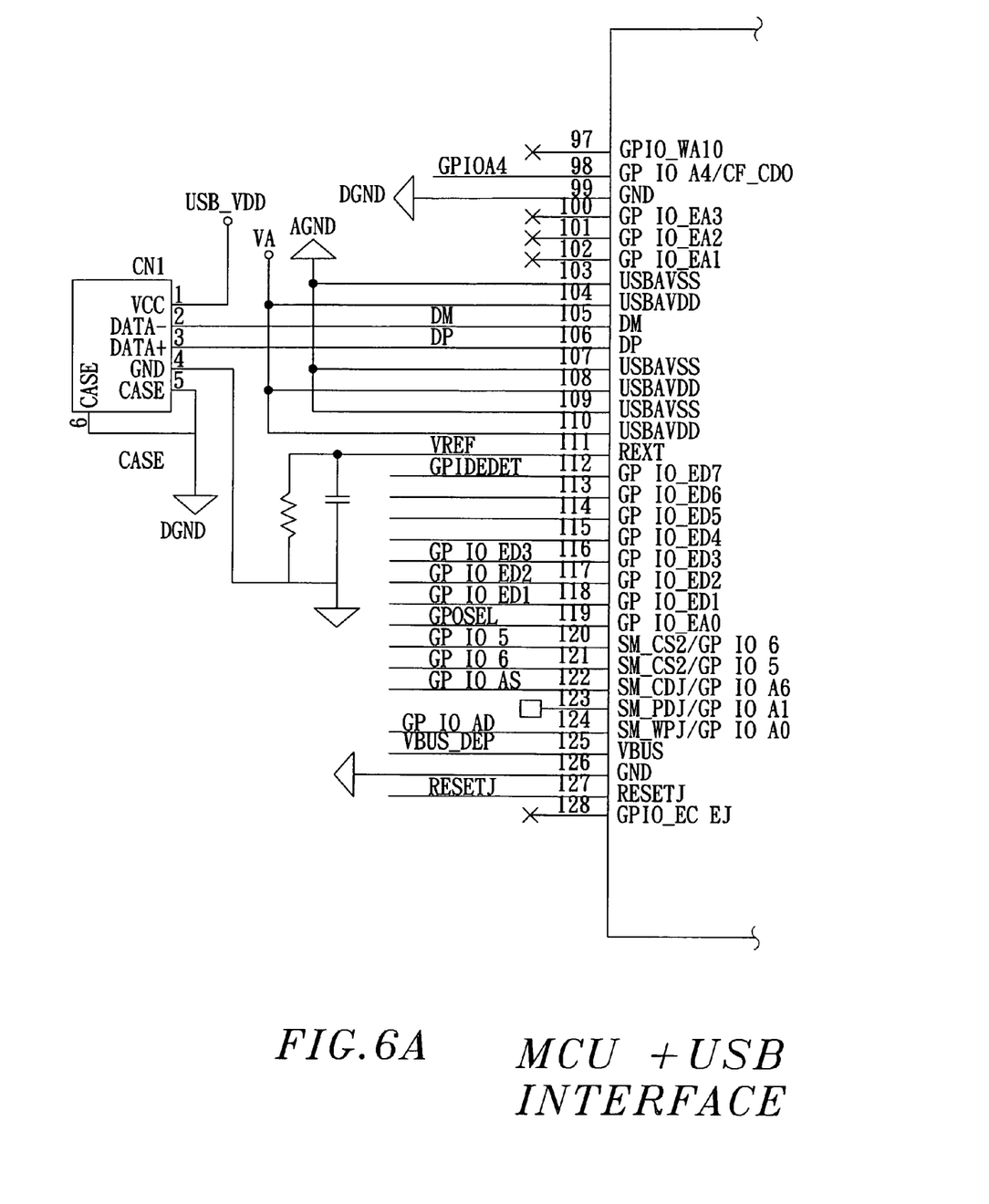
FIGS. 6A-6D are partial views of a circuit diagram according to an embodiment of the present invention.
Figures 6A, 6B, 6C, 6D:
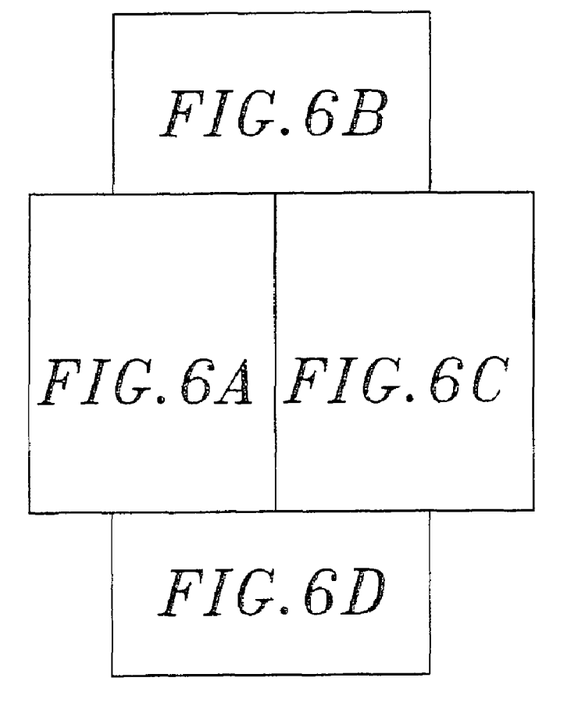
Figure 6B:
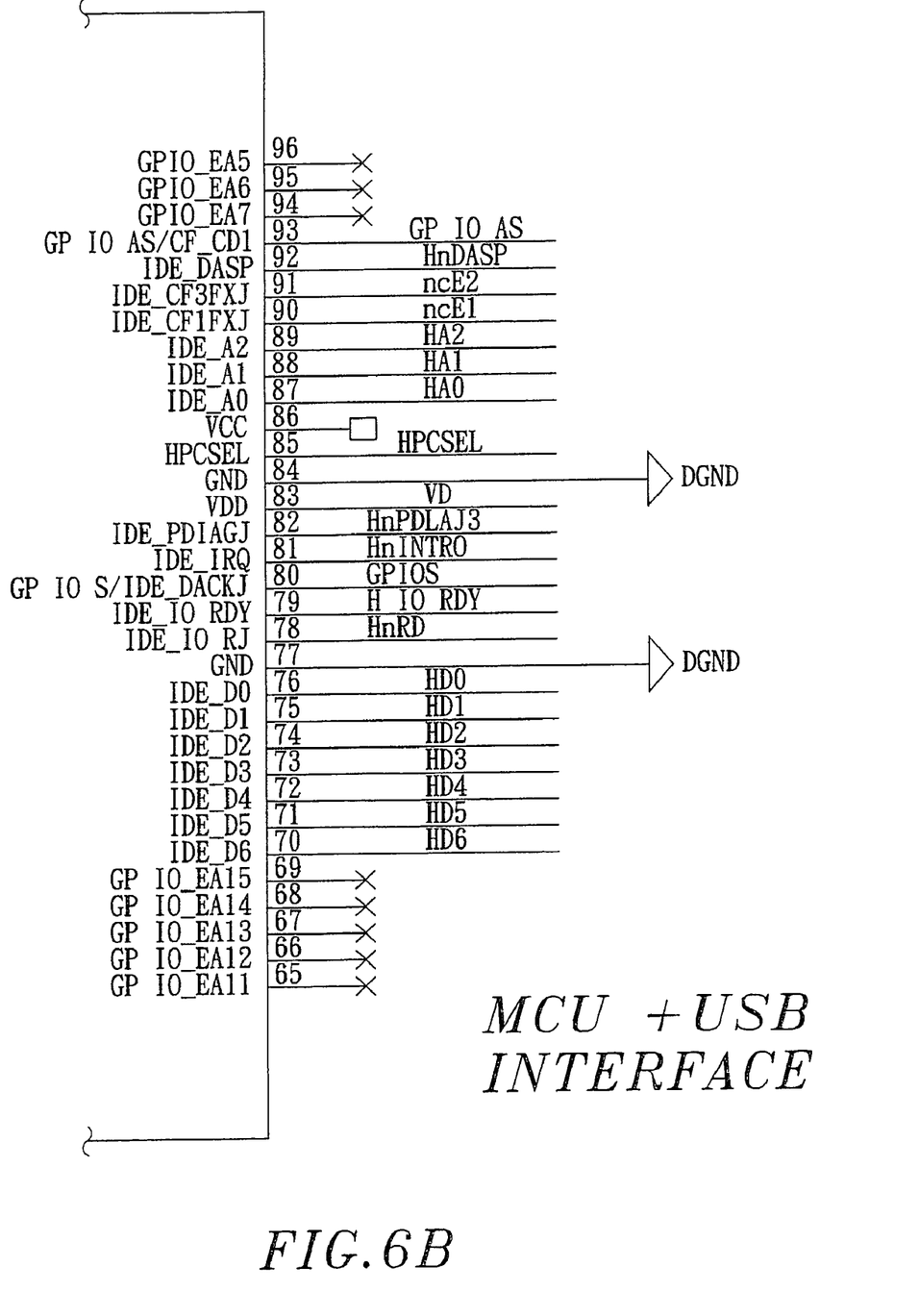
Figure 6C:
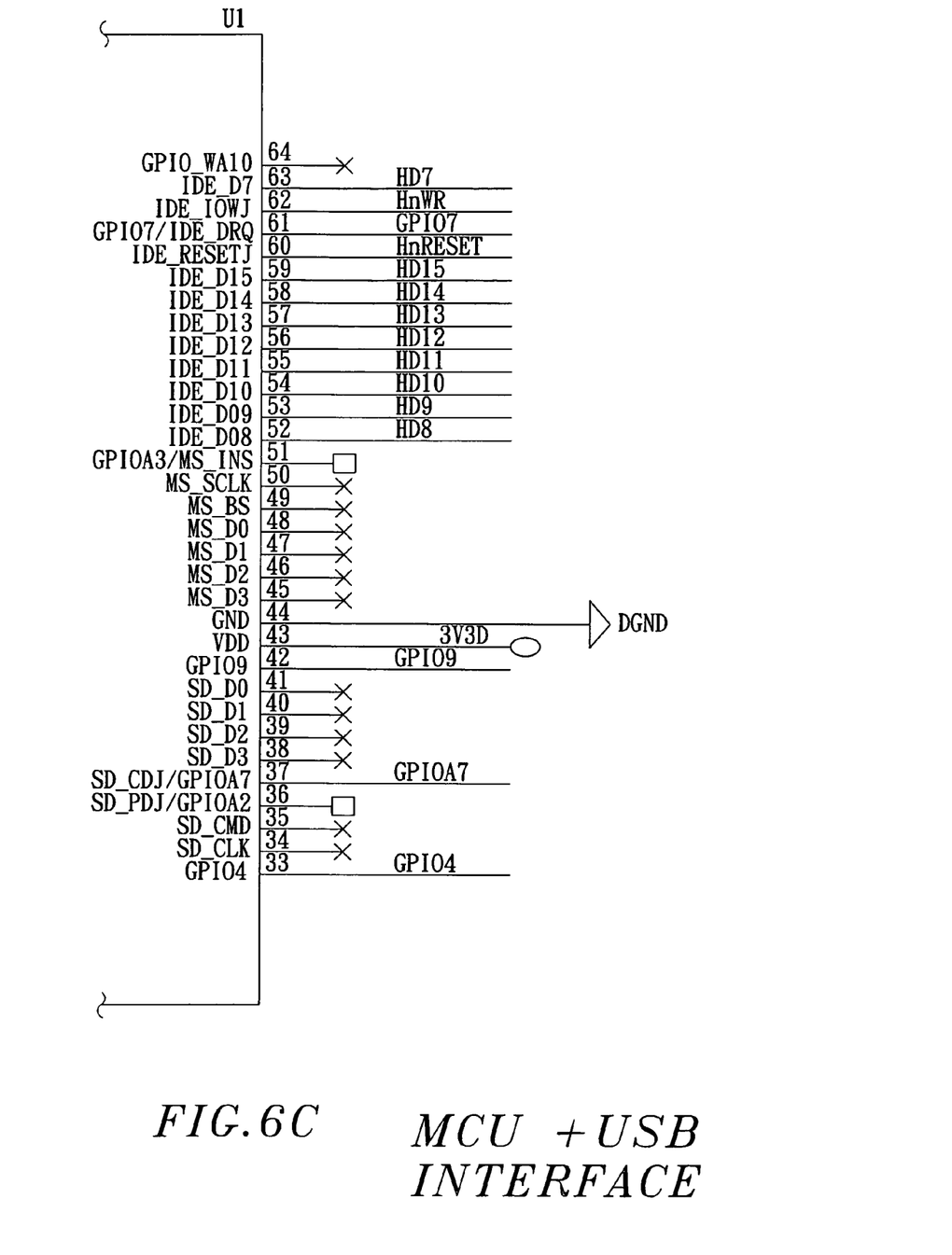
Figure 6D:
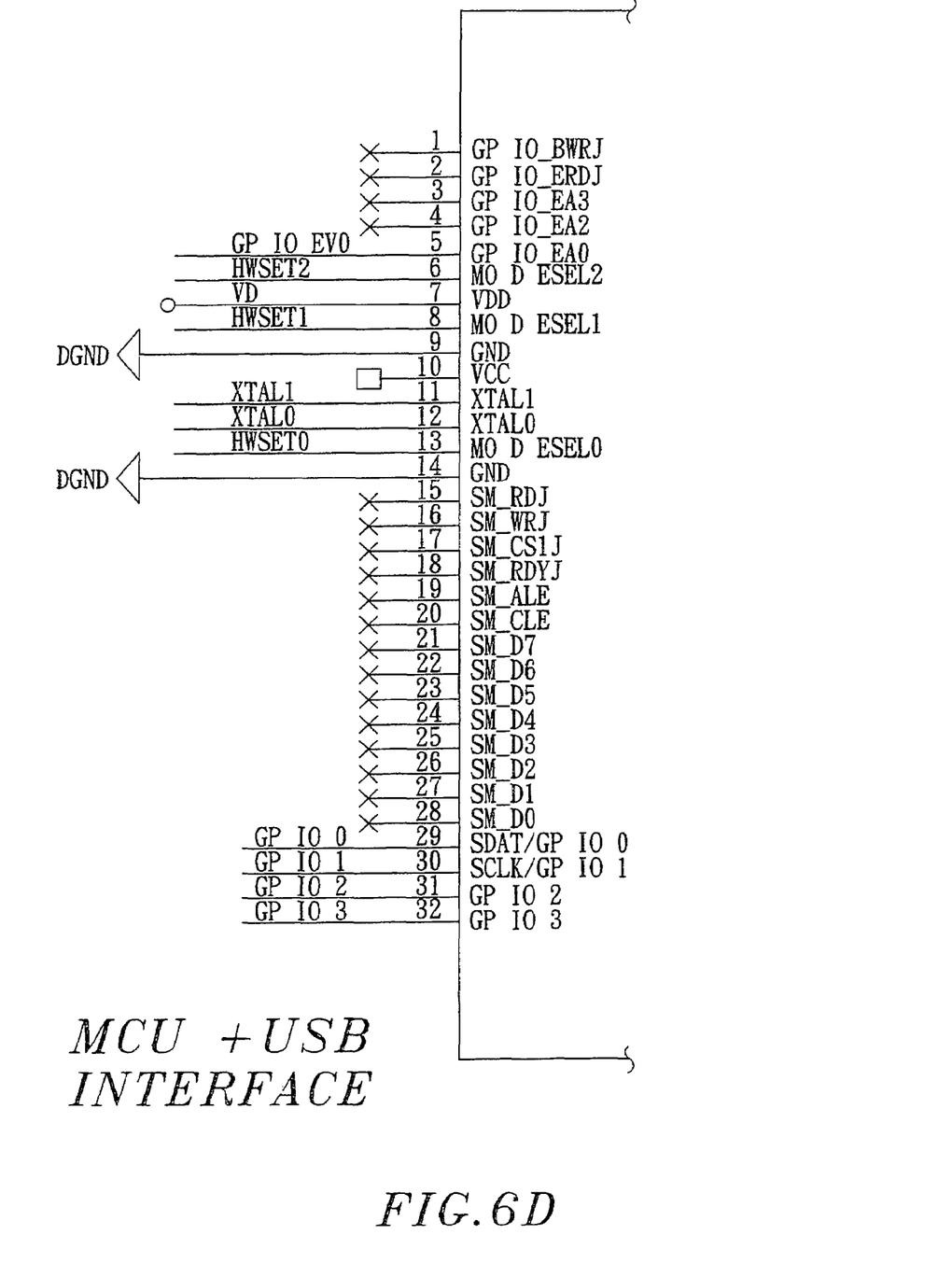
Figure 6E:
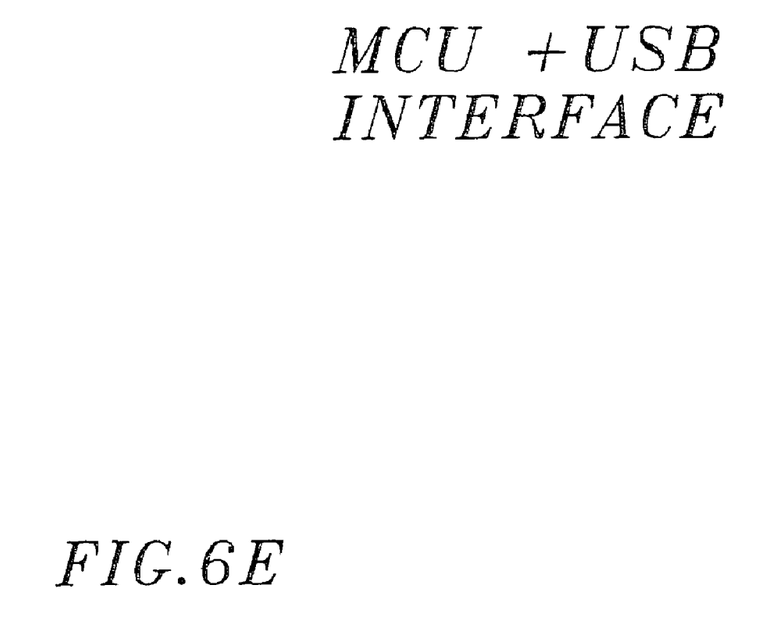
FIG. 6E is a diagram showing how FIGS. 6A, 6B, 6C and 6D mate together.
Figure 7:
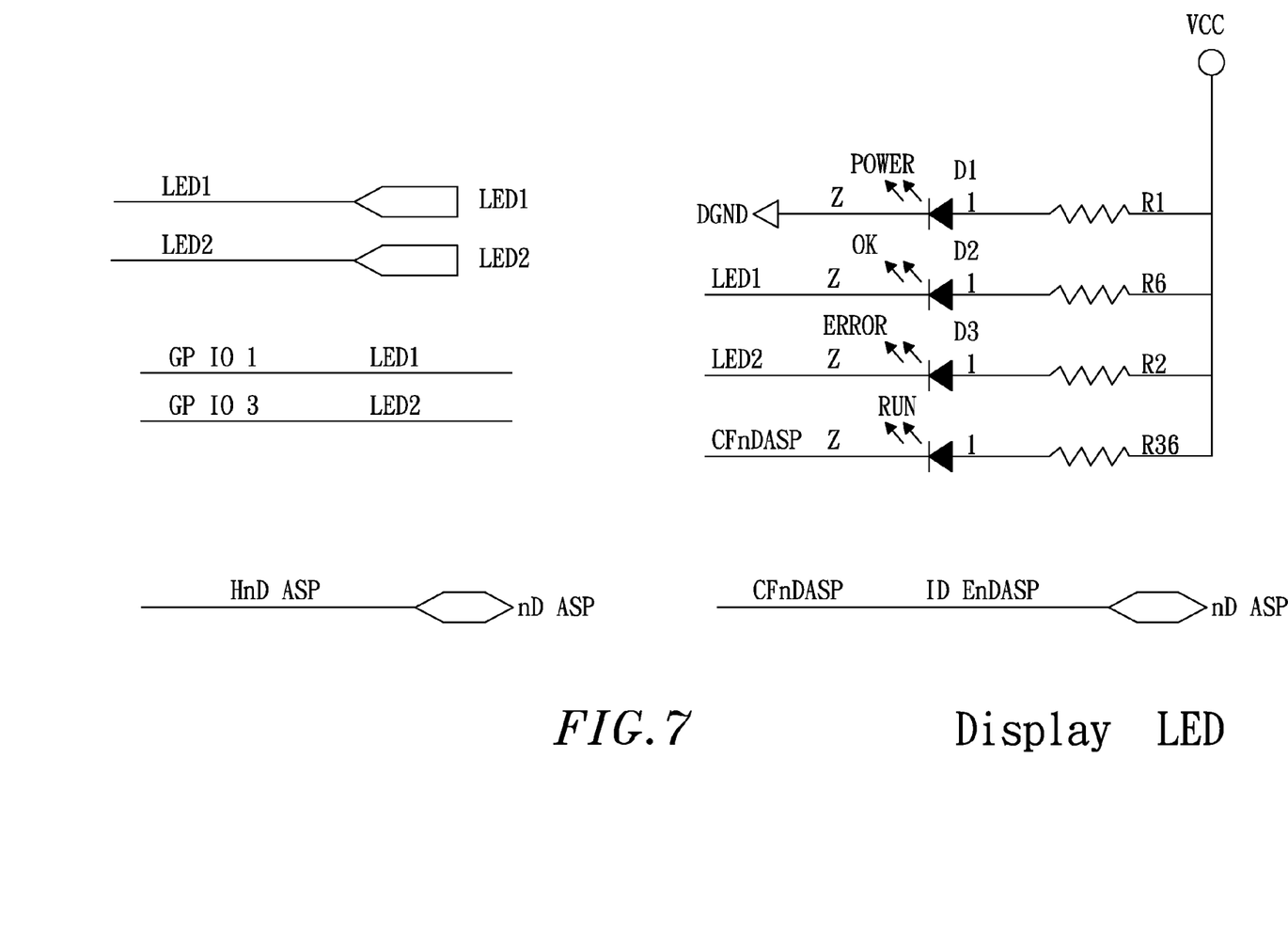
FIG. 7 is a circuit diagram according to an embodiment of the present invention.
Figure 8A:
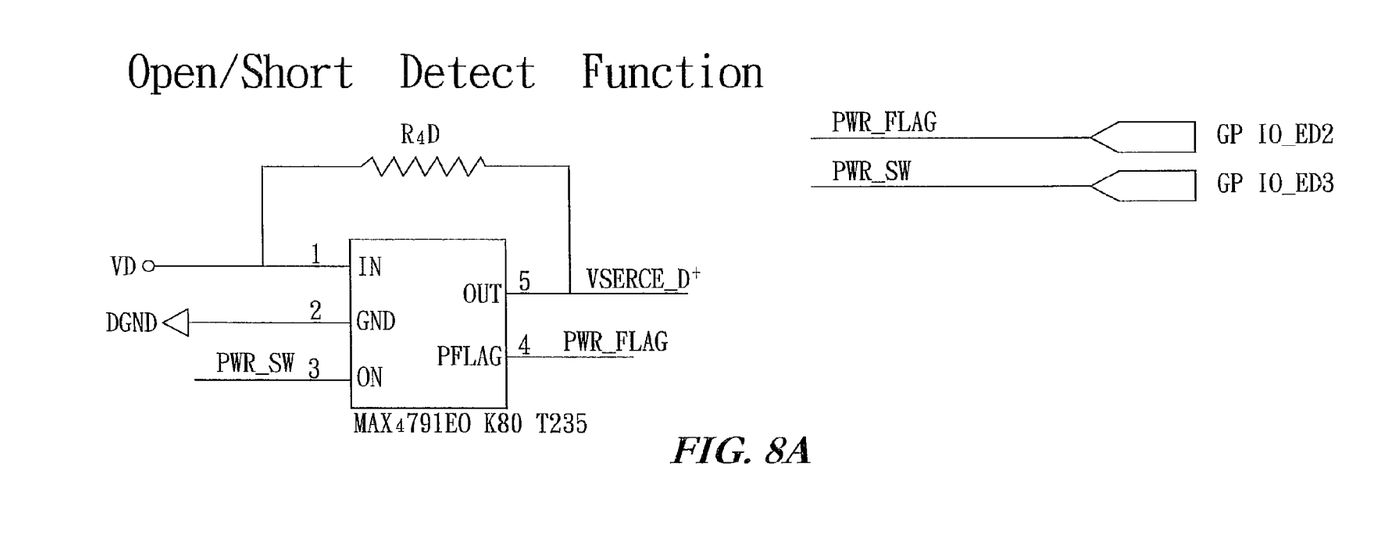
FIGS. 8A-8B are circuit diagrams according to an embodiment of the present invention.
Figure 8B:
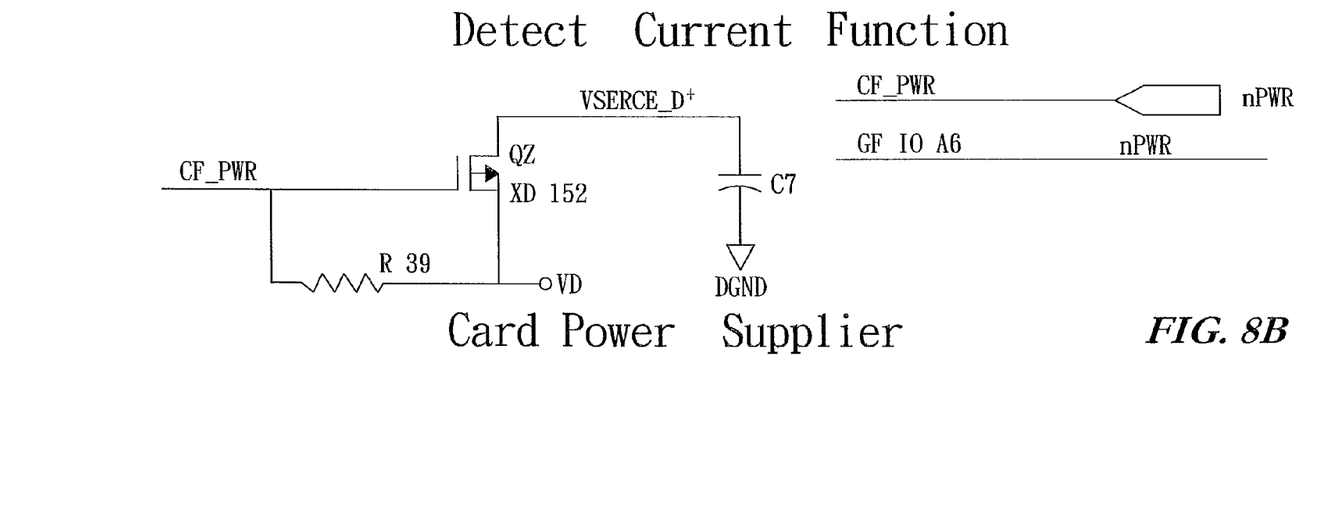
Figure 9:
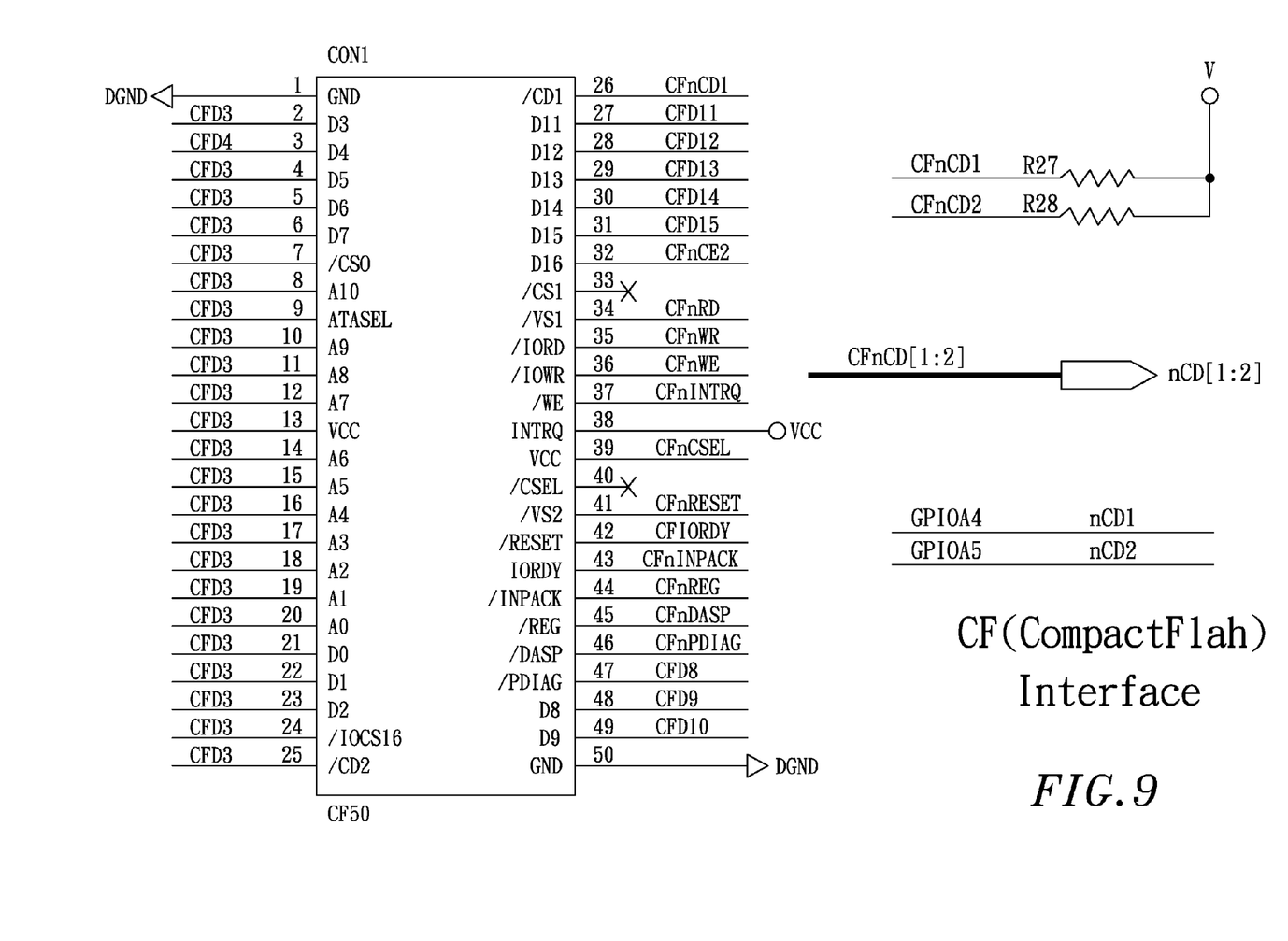
FIG. 9 is a circuit diagram according to an embodiment of the present invention.
Figure 10:
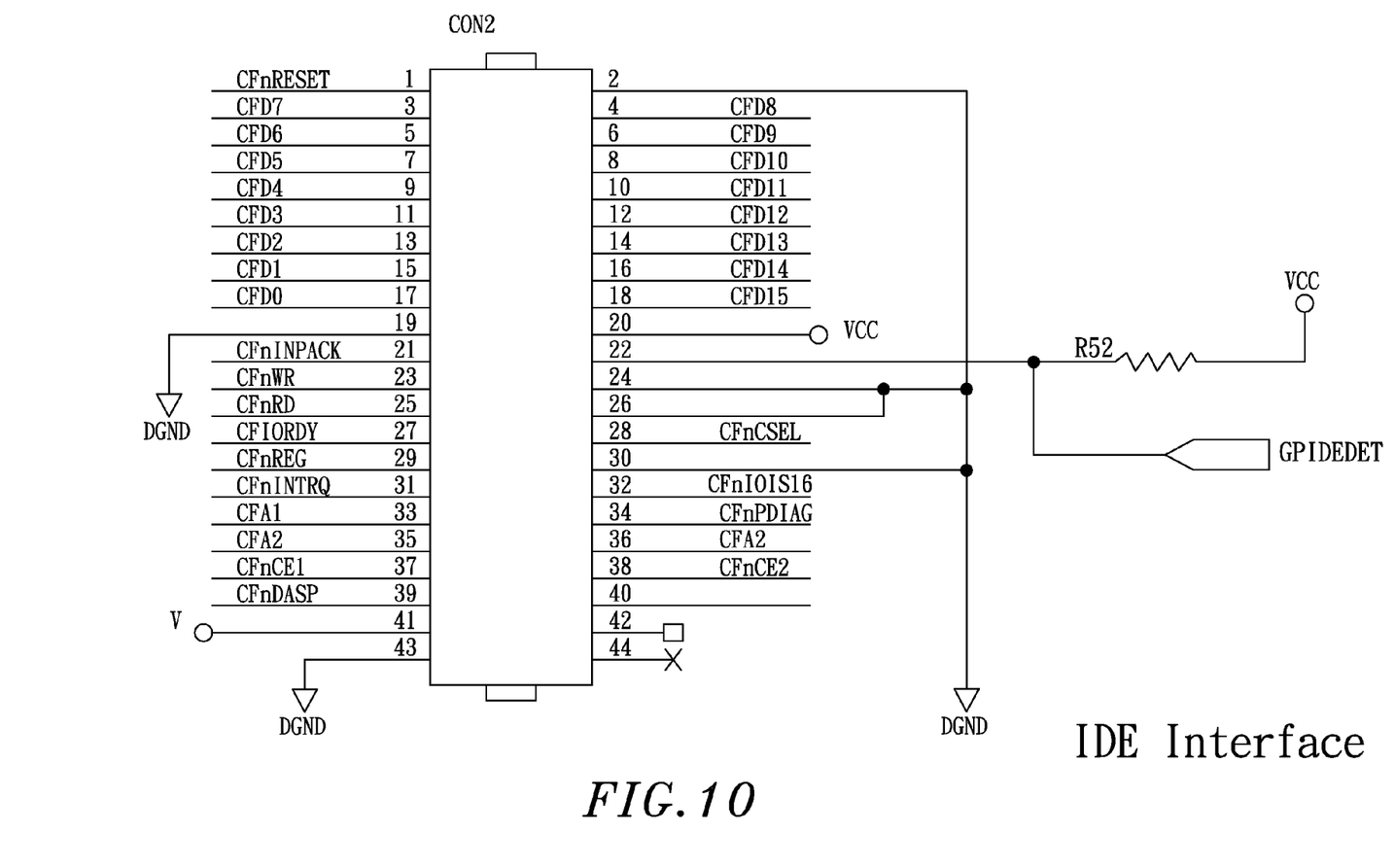
FIG. 10 is a circuit diagram according to an embodiment of the present invention.

Furthermore, referring to FIGS. 5 and 1 again, the test device 1 comprises a plurality of test circuit boards 11, and each of the test circuit boards 11 comprises at least one flash memory card control interface 112. Thus, the test device 1 may be used to test multiple flash memory cards, and each flash memory card has a plurality of interfaces.

The flash memory card may be comprised of multimedia card (MMC), compact flash card (CF), smart media card (SMC), memory stick (MS) and secure digital memory card (SD) or any equivalent thereof.

Accordingly, the present invention has at least the following advantages.

1. The test circuit board 11 is electrically coupled to the connection interface adaptor board 12 via the connection interface 13, and the connection interface adaptor board 12 is used to connect a flash memory card with various interfaces. Thus, the test device 1 may be used to test the flash memory card with various interface by using the various test circuit boards 11 and the connection interface adaptor boards 12. Thus, the cost of the device for testing the flash memory card with various interfaces may be effectively reduced.

2. The power indicator 123, the test normal indicator 124, the under test indicator 125 and the test failure indicator 126 on the connection interface adaptor boards 12 may be adapted for indicating the test result. The built-in application program of the operating system may also be used to indicate the test result.

3. The test circuit boards 11 may comprise at least one flash memory card control interface 112 for enabling the test device 1 to simultaneously test a plurality of flash memory cards. If one of the test circuit board 11 or one of the connection interface adaptor board 12 is damaged, the damaged test circuit board 11 or the damaged connection interface adaptor board 12 may be replaced. Thus, there is no need to repair the whole test device 1, and the time and cost of maintaining the test device 1 can be effectively reduced.

4. When the short circuit occurs, the short circuit detector circuit 1112 turns off the memory card power supply circuit 1113 and cuts off the power supply to the memory card slot 1114 to protect the memory card and the test circuit board 11.

While the invention has been described in conjunction with a specific best mode, it is to be understood that many alternatives, modifications, and variations will be apparent to those skilled in the art in light of the foregoing description. Accordingly, it is intended to embrace all such alternatives, modifications, and variations in which fall within the spirit and scope of the included claims. All matters set forth herein or shown in the accompanying drawings are to be interpreted in an illustrative and non-limiting sense.

What the invention claimed is:

1. A flash memory card test device with multiple interfaces, comprising:

at least one connection interface;

a test circuit board for determining specifications of flash memory cards to be tested, wherein said test circuit board comprises a microprocessor and a memory card slot, said microprocessor determines said specifications of said flash memory cards, and said memory card slot is coupled to said microprocessor and receives a first one of said flash memory cards; and at least one connection interface adaptor board, electrically connected to said test circuit board via said at least one connection interface, for transmitting a test signal from said test circuit board to a second one of said flash memory cards via said at least one connection interface;

wherein a specification of said first one of said flash memory cards is different from a specification of said second one of said flash memory cards.

2. The flash memory card test device with multiple interfaces according to claim 1, wherein said test circuit board comprises a test control circuit and a firmware program to control said test control circuit.

3. The flash memory card test device with multiple interfaces according to claim 1, wherein said test circuit board further comprises a short circuit detector circuit coupled to the microprocessor for detecting a current value.

4. The flash memory card test device with multiple interfaces according to claim 3, wherein said microprocessor comprises a memory card specification detector pin.

5. The flash memory card test device with multiple interfaces according to claim 1, wherein said test circuit board comprises at least one flash memory control interface.

6. The flash memory card test device with multiple interfaces according to claim 1, wherein said at least one connection interface adaptor board comprises a test circuit board connection interface, a connection interface conversion circuit and a flash memory card connection interface.

7. The flash memory card test device with multiple interfaces according to claim 6, wherein said flash memory card connection interface is connected to said second one of the flash memory cards, and said test signal is transmitted via said connection interface conversion circuit to said test circuit board connection interface.

8. The flash memory card test device with multiple interfaces according to claim 1, wherein said at least one connection interface adaptor board comprises a power indicator, a test normal indicator, a under test indicator and a test failure indicator.

9. The flash memory card test device with multiple interfaces according to claim 1, wherein said test device comprises one or a plurality of test circuit boards.

10. The flash memory card test device with multiple interfaces according to claim 1, wherein said flash memory cards are selected from a group consisting of a multimedia card (MMC), a compact flash card (CF), a smart media card (SMC), a memory stick (MS) and a secure digital memory card (SD).

11. The flash memory card test device with multiple interfaces according to claim 1, wherein said test device is operated by a built-in application program of an operating system.

* * * * *